United States Patent [19]

Nagano

[11] 4,442,399

[45] Apr. 10, 1984

[54] CURRENT SOURCE CIRCUIT

[75] Inventor: Katsumi Nagano, Hiratsuka, Japan

[73] Assignee: Tokyo Shibaura Denki Dabushiki Kaisha, Kawasaki, Japan

[21] Appl. No.: 302,774

[22] Filed: Sep. 16, 1981

[30] Foreign Application Priority Data

Oct. 17, 1980 [JP] Japan ............................ 55-145193

[51] Int. Cl.³ .............................................. G05F 3/20
[52] U.S. Cl. ................................... 323/315; 323/268; 307/296 R
[58] Field of Search ............................ 323/268-270, 323/315, 316; 307/296 R, 270, 299 A; 340/347 DA, 347 AD

[56] References Cited

U.S. PATENT DOCUMENTS 3,743,850  7/1973  Davis ........................... 323/315 X
4,119,869 10/1978  Hashimoto .................... 323/315 X
4,280,091  7/1981  Hiltner ........................... 323/315

OTHER PUBLICATIONS

Barker et al., "A Precision Active Current-Splitting Circuit Technique", IEEE Journal of Solid-State Circuits, Jun. 1976, pp. 406-408.

Primary Examiner—Peter S. Wong
Attorney, Agent, or Firm—Finnegan, Henderson, Farabow, Garrett & Dunner

[57] ABSTRACT

A current source circuit includes a first transistor of which collector is connected to a first power source by way of a current source with current $I_0$, three transistors ($Q_{02}$, $Q_{03}$, $Q_{04}$) of a first group of which collector-emitter paths are connected successively in series between the emitter of the first transistor and a second power source and of which collectors and bases are connected each other, and four transistors ($Q_{11}$, $Q_{21}$, $Q_{31}$, $Q_{41}$) of a second group of which bases are connected commonly with the base of the first transistor and collectors are connected to corresponding current output terminals $O_1$, $O_2$, $O_3$ and $O_4$. Emitters of the transistor $Q_{11}$ and the first transistor are connected. A third group of transistors include a transistor $Q_{22}$ of which collector-emitter path is connected between the emitters of the transistor $Q_{21}$ and the transistor $Q_{02}$, transistors $Q_{32}$ and $Q_{33}$ of which collector-emitter paths are connected between emitters of the transistor $Q_{31}$ and the transistor $Q_{03}$ in series, and transistor $Q_{42}$, $Q_{43}$ and $Q_{44}$ of which the collector-emitter paths are connected between emitters of the transistor $Q_{41}$ and the transistor $Q_{04}$ in series. Emitter areas of the transistors are selectively set so that the current output terminals $O_1$, $O_2$, $O_3$ and $O_4$ produce currents $I_0$, $2I_0$, $4I_0$ and $8I_0$, respectively.

12 Claims, 7 Drawing Figures

F I G. 2
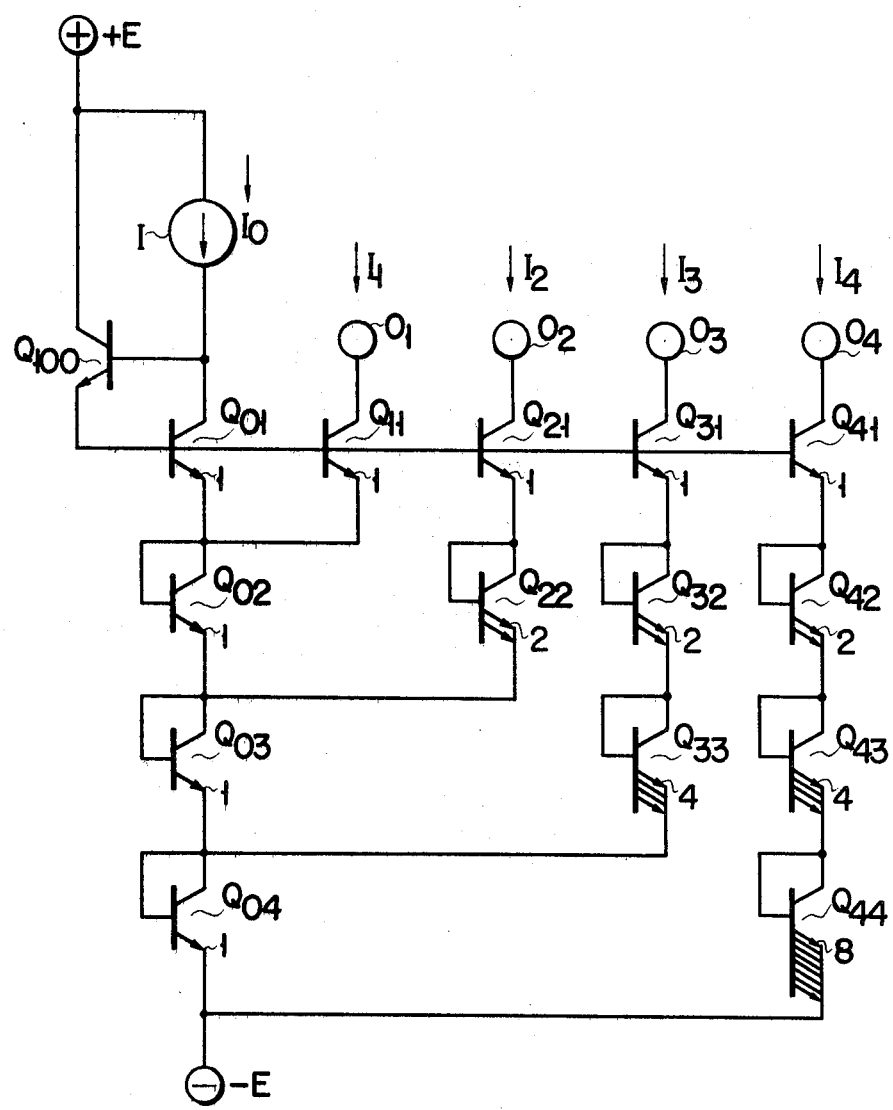

F I G. 3
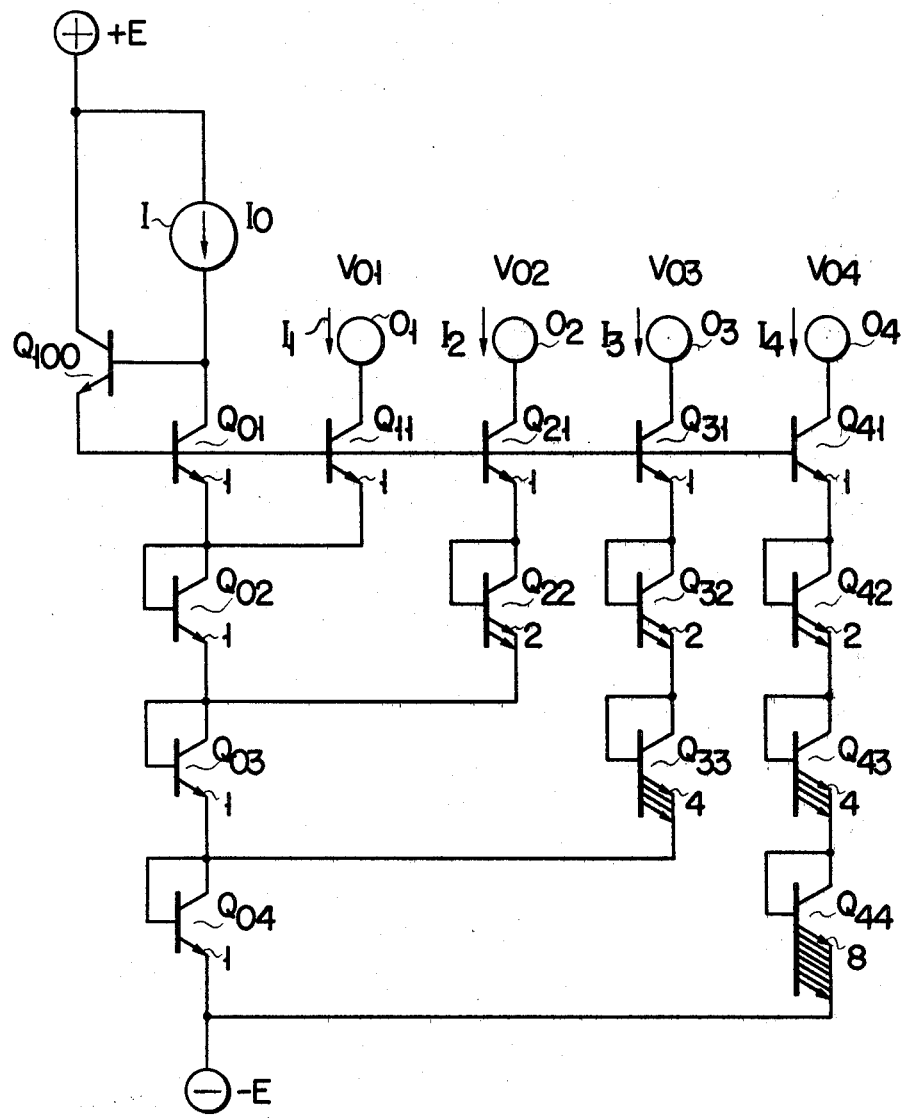

CURRENT SOURCE CIRCUIT

BACKGROUND OF THE INVENTION

The present invention relates to a current source circuit, and more particularly to a current source circuit for producing a plurality of currents with their own weights for use in a digital to analog (D/A) converter, for example.

A D/A converter using R-2R ladder resistors has been fabricated by the IC technology. The D/A converter is based on a principle that a plurality of currents shunted by the R-2R ladder resistors are weighted in accordance with bits, respectively. Since a converting accuracy of the D/A converter using the ladder resistors depends on ratios of resistances of the resistors, it is necessary, for the IC fabrication of the D/A converter, to minimize errors of the shunting resistance ratios by widening the widths of patterns of the shunting resistors. This is undesirable because areas occupied by the shunting resistors on a semiconductor chip are large.

SUMMARY OF THE INVENTION

Accordingly, the present invention has an object to provide a current source circuit with a simple construction and of small size well adaptable for the D/A converter, for example, with an arrangement of a plurality of transistors that a plurality of currents with their proper weights are produced from a plurality of current output terminals, respectively.

According to the present invention, there is provided a current source circuit comprising, a first transistor ($Q_{01}$) of which the collector is connected to a first power source through a current source; first group transistors of (N−1) ($Q_{02}, Q_{03}, \ldots, Q_{0K}, \ldots, Q_{0N}$) of which collector-emitter paths are connected between the emitter of the first transistor and a second power source, successively from the first transistor in series, and of which collectors and bases are connected together, respectively; second group transistors of N ($Q_{11}, Q_{21}, \ldots, Q_{K1}, \ldots, Q_{N1}$) of which the bases are connected with the base of the first transistor commonly, and the respective collectors are connected to the corresponding output terminals ($O_1, O_2, \ldots, O_K, \ldots, O_N$), the second group transistors successively corresponding to the first transistor and the first group transistors; means for connecting the emitters of the first order transistor ($Q_{11}$) of the second group transistors and the first transistor; and third group transistors of (K−1) of which the collector-emitter paths are connected between emitters of the second group transistor $Q_{K1}$ (K=2, 3, ..., N) and the first group transistors $Q_{0K}$ (K=2, 3, ..., N) corresponding to the second group transistor $Q_{K1}$.

By setting the emitter areas of the transistors in such a current source circuit to predetermined values, currents with different weights may be produced from the current output terminals, $O_1, O_2, \ldots, O_K, \ldots, O_N$, respectively.

BRIEF DESCRIPTION OF THE DRAWINGS

FIG. 2 is a circuit diagram of a current source circuit with a transistor for correcting a current amplification factor which is a second embodiment of present invention;

FIG. 3 is a circuit diagram of a current source circuit for computer-simulating the second embodiment shown in FIG. 2;

DETAILED DESCRIPTION OF THE PREFERRED EMBODIMENTS

Figure 1:
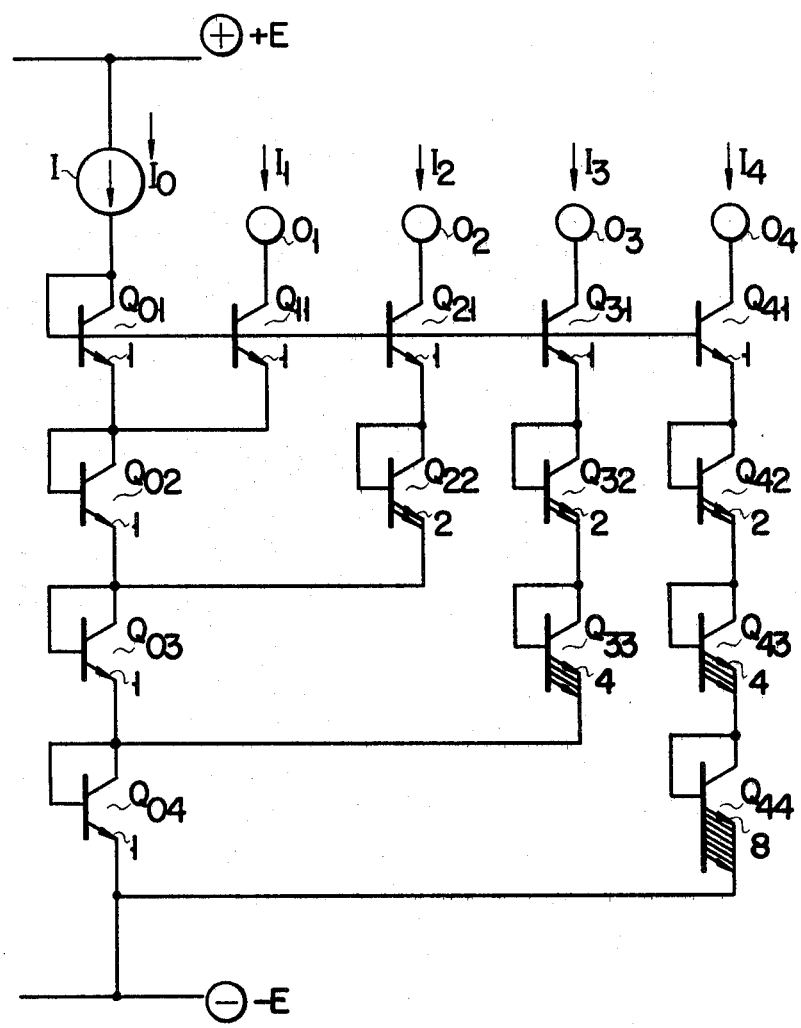
FIG. 1 shows a circuit diagram of a current source circuit for producing output currents of 4 bits which is a first embodiment of the present invention.

Refering now to FIG. 1, there is shown an arrangement of a current source circuit for producing a plurality of output currents with weights 1:2:4:8 which is used in a D/A converter of 4 bits. As shown, the current source circuit is comprised of NPN transistors. Transistors of which the collectors are connected to the bases, serving as diodes, that is, a first transistor $Q_{01}$ and first group transistors $Q_{02}$ to $Q_{04}$, are so arranged that the collector-emitter paths of those transistors are connected in a series fashion. The collector of the first transistor $Q_{01}$ is connected through a current source I to a positive power source (+E) as a first power source. The emitter of the transistor $Q_{04}$ is connected to a negative power source (−E) as a second power source. Those transistors $Q_{01}$ to $Q_{04}$ cooperatively make up a main current path for the current source circuit. Four second group transistors $Q_{11}, Q_{21}, Q_{31}$ and $Q_{41}$ are connected together at the bases to the base of the first transistor $Q_{01}$. The collectors of the transistors $Q_{11}, Q_{21}, Q_{31}$ and $Q_{41}$ are respectively connected to current output terminals $O_1$ to $O_4$. The emitter of the transistor $Q_{11}$ is connected to the emitter of the first transistor $Q_{01}$. As to third group transistors $Q_{22}$; $Q_{32}$ and $Q_{33}$; and $Q_{42}$ to $Q_{44}$; the bases of the third group transistors are connected to the collectors thereof, respectively. A collector-emitter path of the transistor $Q_{22}$ is inserted between the emitters of the transistors $Q_{21}$ and $Q_{02}$. The collector-emitter paths of the transistors $Q_{32}$ and $Q_{33}$ are inserted in a series fashion between the emitters of the transistors $Q_{31}$ and $Q_{03}$. Similarly, the collector-emitter paths of the transistors $Q_{42}$ to $Q_{44}$ are arranged in a series fashion between the emitters of the transistors $Q_{41}$ and $Q_{04}$. The transistors $Q_{22}, Q_{32}$ and $Q_{42}$ are multi-emitter transistors with two emitters; the transistors $Q_{33}$ and $Q_{43}$ are multi-emitter transistors with four emitters and the transistor $Q_{44}$ is a multi-emitter transistor with eight emitters. In the figure, numerals attached to the emitters represent the numbers of the emitters. When emitter areas of the first transistor $Q_{01}$, the first group transistors $Q_{02}$ to $Q_{04}$ and the second group transistors $Q_{11}, Q_{21}, Q_{31}$ and $Q_{41}$ are each represented by '1', the emitter areas of the third group transistors $Q_{22}, Q_{32}$ and $Q_{42}$ are each represented by '2', the emitter areas of the transistors $Q_{33}$ and $Q_{43}$ are represented by '4', and the emitter area of the transistor $Q_{44}$ is represented by '8'.

The operation of the current source circuit shown in FIG. 1 will be described. Let a current supplied from the power source I to this power source circuit be $I_0$, and current values obtained at voltage output terminals $O_1$, $O_2$, $O_3$ and $O_4$ be $I_1$, $I_2$, $I_3$ and $I_4$ respectively. $I_1$, $I_2$, $I_3$ and $I_4$ are given by an equation (1)

$$\left.\begin{array}{l} I_1 = I_0 \\ I_2 = 2I_0 \\ I_3 = 4I_0 \\ I_4 = 8I_0 \end{array}\right\} \quad (1)$$

The equation (1) can be obtained in the following manner. Assume that all the transistors operate in an active region. Then, a voltage $V_{BE}$ between the base and emitter and a collector current Ic is given by an equation (2)

$$V_{BE} = V_T \ln(I_c/nAI_s) \quad (2)$$

where $V_T$ is a thermionic voltage, $I_s$ is a reverse saturation current, A is a junction area between the base and emitter, and n is an area ratio of the emitter.

A base-emitter voltage of the first transistor $Q_{01}$ is equal to that of the second group transistor $Q_{11}$. That is to say, $V_{BE}(Q_{01}) = V_{BE}(Q_{11})$. Substituting the equation (2) into this equation and expressing n and $I_c$ by those values of the corresponding transistors $$V_T \ln \frac{I_0}{1 \cdot A \cdot I_s} = V_T \ln \frac{I_1}{1 \cdot A \cdot I_s} \quad (3)$$

and hence $$I_0 = I_1 \quad (4)$$

The sum of the base-emitter voltages of the first transistor $Q_{01}$ and the first group transistor $Q_{02}$ are equal to the sum of the base-emitter voltages of the second group transistor $Q_{21}$ and the third group transistor $Q_{22}$. Accordingly, the following equation holds $$V_{BE}(Q_{01}) + V_{BE}(Q_{02}) = V_{BE}(Q_{21}) + V_{BE}(Q_{22})$$

As in the above case, substituting the euqation (2) into the above equation and expressing n and $I_c$ by those values of the corresponding transistors, we have $$V_T \ln \frac{I_0}{1 \cdot A \cdot I_s} + V_T \ln \frac{I_0 + I_1}{1 \cdot A \cdot I_s} = \quad (5)$$

$$V_T \ln \frac{I_2}{1 \cdot A \cdot I_s} + V_T \ln \frac{I_2}{2 \cdot A \cdot I_s}$$

and by substituting the relation of $I_1 = I_0$ of the equation (4) into the equation (5), we obtain $$2I_0{}^2 = I_2{}^2/2$$

Arranging the above equation with respect to $I_2$, we have $$I_2 = 2I_0 \quad (6)$$

Further, the sum of the base-emitter voltage $V_{BE}$ of the transistors $Q_{01}$, $Q_{02}$ and $Q_{03}$ are equal to that of the base-emitter voltages of the transistors $Q_{31}$, $Q_{32}$ and $Q_{33}$. That is, the following equation holds.

$$V_{BE}(Q_{01}) + V_{BE}(Q_{02}) + V_{BE}(Q_{03}) = V_{BE}(Q_{31}) + V_{BE}(Q_{32}) + V_{BE}(Q_{33})$$

Hence, we have $$V_T \ln \frac{I_0}{1 \cdot A \cdot I_s} + V_T \ln \frac{I_0 + I_1}{1 \cdot A \cdot I_s} + V_T \ln \frac{I_0 + I_1 + I_2}{1 \cdot A \cdot I_s} = \quad (7)$$

$$V_T \ln \frac{I_3}{1 \cdot A \cdot I_s} + V_T \ln \frac{I_3}{2 \cdot A \cdot I_s} + V_T \ln \frac{I_3}{4 \cdot A \cdot I_s}$$

When substituting the equations (4) and (6) into the equation (7), we obtain $$1 \cdot 2 \cdot 4 I_0{}^3 = \frac{I_3{}^3}{1 \cdot 2 \cdot 4}$$

Hence, we have $$I_3 = 4I_0 \quad (8)$$

Similarly, the sum of the base-emitter voltages $V_{BE}$ of the transistors $Q_{01}$, $Q_{02}$, $Q_{03}$ and $Q_{04}$ is equal to that of the base-emitter voltages $V_{BE}$ of the transistors $Q_{41}$, $Q_{42}$, $Q_{43}$ and $Q_{44}$. Therefore, the following equation holds $$V_{BE}(Q_{01}) + V_{BE}(Q_{02}) + V_{BE}(Q_{03}) + V_{BE}(Q_{04}) = V_{BE}(Q_{41}) + V_{BE}(Q_{42}) + V_{BE}(Q_{43}) + V_{BE}(Q_{44})$$

substituting the equation (2) into the above equation and expressing it in terms of the values n and $I_c$ of the corresponding transistors, we obtain $$V_T \ln \frac{I_0}{1 \cdot A \cdot I_s} + V_T \ln \frac{I_0 + I_1}{1 \cdot A \cdot I_s} + V_T \ln \frac{I_0 + I_1 + I_2}{1 \cdot A \cdot I_s} + \quad (9)$$

$$V_T \ln \frac{I_0 + I_1 + I_2 + I_3}{1 \cdot A \cdot I_s} = V_T \ln \frac{I_4}{1 \cdot A \cdot I_s} + V_T \ln \frac{I_4}{2 \cdot A \cdot I_s} +$$

$$V_T \ln \frac{I_4}{4 \cdot A \cdot I_s} + V_T \ln \frac{I_4}{8 \cdot A \cdot I_s}$$

Substituting the equations (4), (6) and (8) into the equation (9), we obtain $$1 \cdot 2 \cdot 4 \cdot 8 I_0{}^4 = \frac{I_4{}^4}{1 \cdot 2 \cdot 4 \cdot 8}$$

Then, arranging the above equation with respect to $I_4$, we have $$I_4 = 8I_0 \quad (10)$$

As seen from the equations (4), (6), (8) and (10), output currents weighted 1, 2, 4 and 8 can be produced out of the current output terminals $O_1$ to $O_4$ respectively when the transistors are arranged as shown in FIG. 1 and the emitter areas of these transistors are selectively set as mentioned above. Since a D/A converter requires a plurality of currents weighted in a geometrical series, for example, the currents $I_1$, $I_2$, $I_3$ and $I_4$, it is evident that the current source circuit shown in FIG. 1 can be used for the D/A converter. Since the arrangement of this current source circuit is simple and an area on a semiconductor chip occupied by the current source circuit is small, it can be arranged small enough to be used in an IC circuit.

A current source in which errors of the output terminal currents $I_1$, $I_2$, $I_3$ and $I_4$ shown in FIG. 1 are compensated for will be described referring to FIG. 2. In FIG. 2, like symbols are used for designating like portions in FIG. 1, with omission of the explanation thereof for simplicity. In FIG. 1, the bases of the first transistor $Q_{01}$ and the transistors $Q_{11}$ to $Q_{41}$ of the second group are connected together one another. Therefore, the true collector current $I_c(Q_{01})$ of the first transistor of $Q_{01}$ shown in FIG. 1 is a current obtained by subtracting the sum of the base currents of the transistors $Q_{01}$, $Q_{11}$, $Q_{21}$, $Q_{31}$ and $Q_{41}$ from the constant current $I_0$ flowing through the current source I, and the current $I_c(Q_{01})$ is expressed by the following equation (11)

$$I_c(Q_{01}) = I_0 - \frac{1}{\beta}(I_0 + I_1 + I_2 + I_3 + I_4) \quad (11)$$

$$= \left(1 - \frac{16}{\beta}\right) I_0$$

where, $\beta$ is a common emitter current gain of the first transistor and the second group transistors (NPN type). Assume that the current amplifying factor is "100". Then, it is apparent from the equation (11) that the true collector current $I_c(Q_{01})$ of the first transistor $Q_{01}$ is 16% smaller than the constant current $I_0$ of the current source. As mentioned above, since the collector current of the first transistor $Q_{01}$ decreases due to the base currents of the transistors $Q_{01}$ to $Q_{41}$, the base-emitter voltages $V_{BE}$ of the transistor $Q_{01}$ to $Q_{41}$ on which the calculation for the currents $I_1$, $I_2$, $I_3$ and $I_4$ is based, is influenced. Therefore, there occur errors in the output terminal currents $I_1$ to $I_4$. In FIG. 2, a second transistor $Q_{100}$ is provided in order to remove the errors of the output terminal currents $I_1$ to $I_4$. The collector, base and emitter of the second transistor $Q_{100}$ are connected to a positive power source ($+E$) (a first power source), the collector of the first transistor $Q_{01}$ and the base of the first transistor $Q_{01}$, respectively. As a result, a true collector current $I_c'(Q_{01})$ of the first transistor $Q_{01}$ in the current source circuit shown in FIG. 2 is obtained by subtracting from the constant current $I_0$ the quotient when the sum of the output terminal voltages $I_1$, $I_2$, $I_3$ and $I_4$ is divided by $\beta^2$, and is given by an equation (12)

$$I_c'(Q_{01}) = I_0 - \frac{1}{\beta^2}(I_0 + I_1 + I_2 + I_3 + I_4) \quad (12)$$

$$= \left(1 - \frac{16}{\beta^2}\right) I_0$$

As seen from the equation (12), the error of the collector current of the first transistor $Q_{01}$ is no more than 0.16%.

Figure 4:
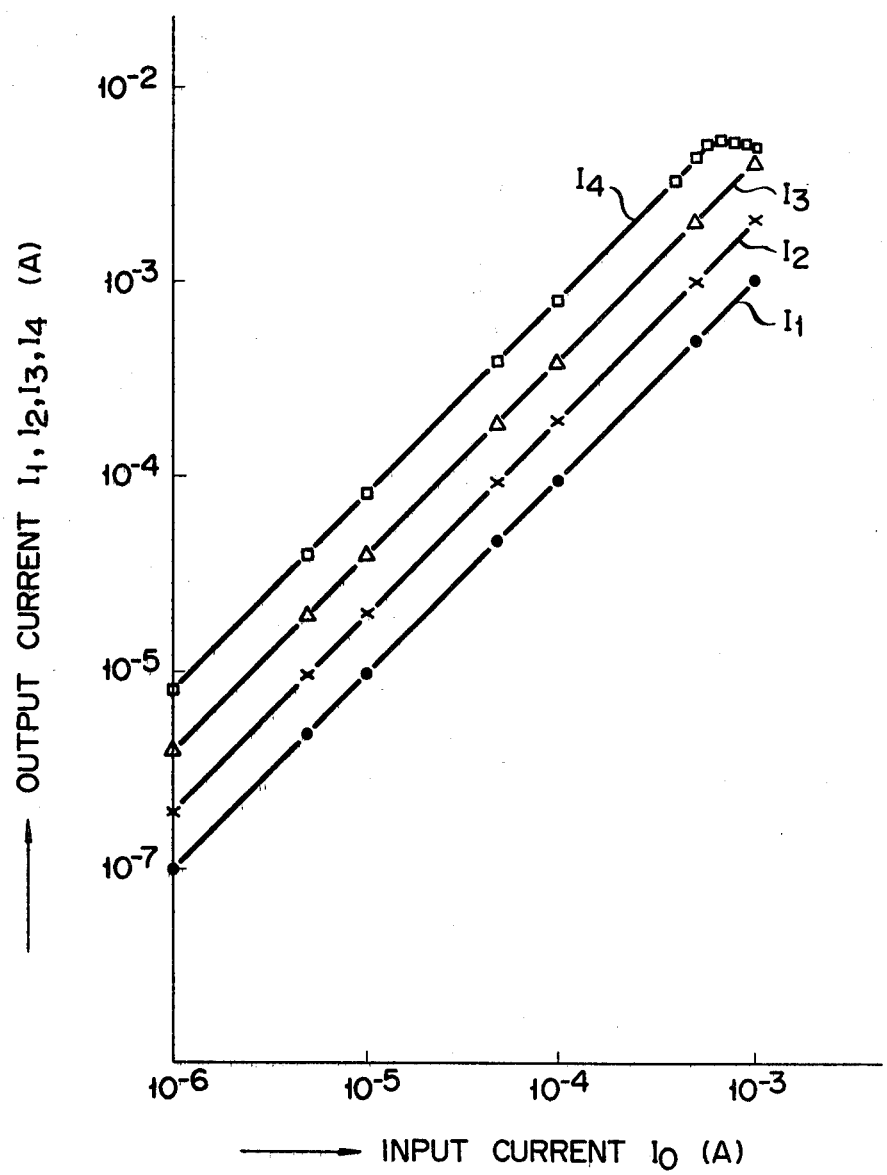
FIG. 4 is a graphical representation of output current characteristics as the results of the computer-simulation of the current source circuit shown in FIG. 3.

The inventor of the present patent application executed a computer simulation of the current source circuit shown in FIG. 3 by using the known SPICE program in order to check the errors of the output terminal currents $I_1$ to $I_4$ ascribed to the above-mentioned current amplifying factor $\beta$. In FIG. 3, the transistors $Q_{11}$, $Q_{21}$, $Q_{31}$ and $Q_{41}$ were each supplied with voltage of 3.5 V at the current output terminals $O_1$, $O_2$, $O_3$ and $O_4$, respectively, and the constant current $I_0$ of the current source I was varied. The results of the simulation of the collector currents $I_1$, $I_2$, $I_3$ and $I_4$ of the transistors $Q_{11}$, $Q_{21}$, $Q_{31}$ and $Q_{41}$ in the simulation are shown in the table 1. Further, relationships between a current source current $I_0(A)$ obtained from the table 1 and the collector currents $I_1$, $I_2$, $I_3$ and $I_4(A)$ are illustrated in FIG. 4.

TABLE 1

| $I_0(\mu A)$ | $I_1(\mu A)$ | $I_2(\mu A)$ | $I_3(\mu A)$ | $I_4(\mu A)$ |
|---|---|---|---|---|
| 1 | 0.963 | 1.945 | 3.920 | 7.890 |
| 5 | 4.911 | 9.878 | 19.85 | 39.84 |
| 10 | 9.866 | 19.82 | 39.79 | 79.80 |
| 50 | 49.60 | 99.47 | 199.3 | 399.2 |
| 100 | 99.31 | 199.0 | 398.6 | 797.7 |
| 500 | 496.5 | 993.7 | 1986 | 4223 |
| 1000 | 943.3 | 1887 | 3937 | 5205 |

From table 1, the errors of the collector currents of the transistors $Q_{11}$, $Q_{21}$, $Q_{31}$ and $Q_{41}$, i.e. the output currents $I_1$, $I_2$, $I_3$ and $I_4$, can respectively be obtained in accordance with the following equations $$\epsilon(I_1) = \frac{I_1 - I_0}{I_0} \times 100, \quad \epsilon(I_2) = \frac{I_2 - 2I_0}{2I_0} \times 100$$

$$\epsilon(I_3) = \frac{I_3 - 4I_0}{4I_0} \times 100, \quad \epsilon(I_4) = \frac{I_4 - 8I_0}{8I_0} \times 100$$

Relations of current source currents $I_0$ and the errors $\epsilon(I_1)$, $\epsilon(I_2)$, $\epsilon(I_3)$ and $\epsilon(I_4)$ obtained in accordance with the above equations are tabulated in table 2.

TABLE 2

| $I_0(\mu A)$ | $\epsilon(I_1)$ % | $\epsilon(I_2)$ % | $\epsilon(I_3)$ % | $\epsilon(I_4)$ % |
|---|---|---|---|---|
| 1 | −3.7 | −2.8 | −2.0 | −1.4 |
| 5 | −1.8 | −1.2 | −0.75 | −0.20 |
| 10 | −1.3 | −0.90 | −0.53 | −0.25 |
| 50 | −0.80 | −0.53 | −0.35 | −0.20 |
| 100 | −0.69 | −0.50 | −0.35 | −0.29 |
| 500 | −0.70 | −0.63 | −0.70 | −5.6 |
| 1000 | −5.7 | −5.7 | −1.6 | −34.9 |

Figure 5:
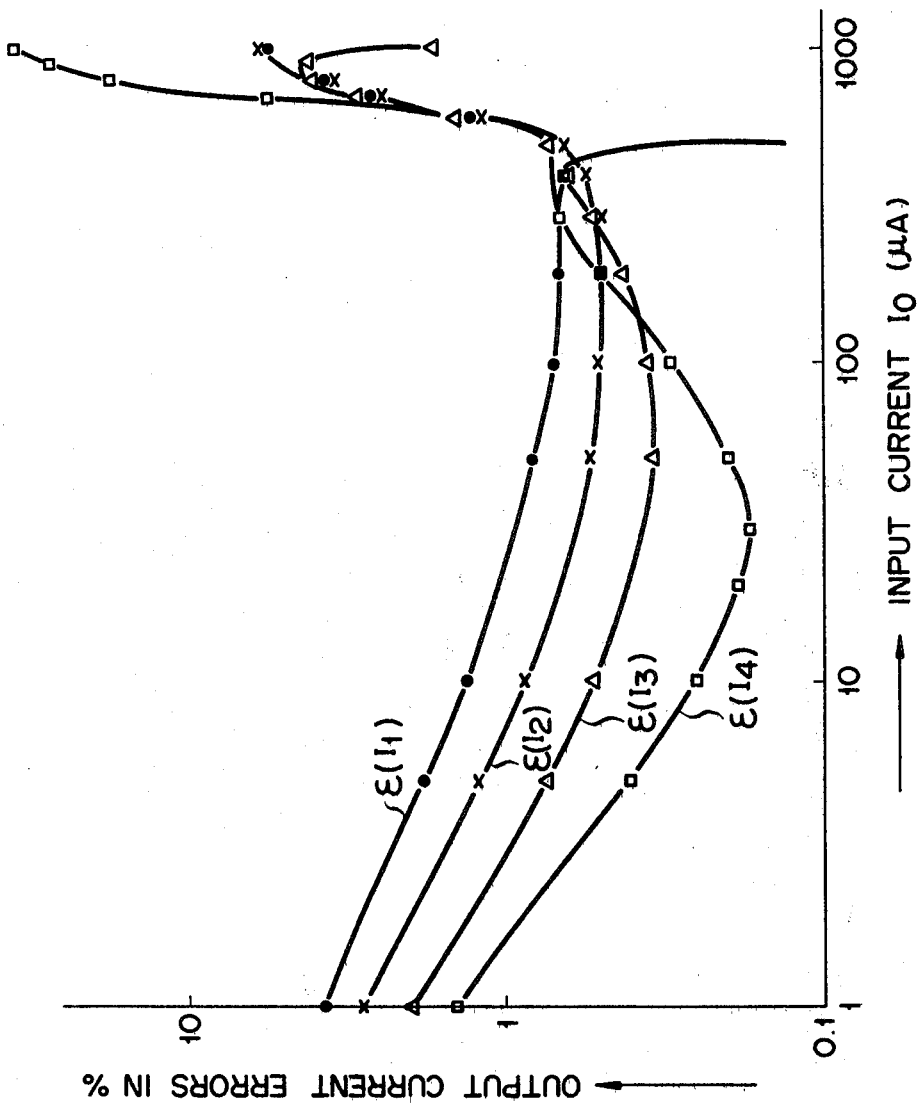
FIG. 5 is a graphical representation of output current error characteristics as the results of the computer-simulation of the FIG. 3 current source circuit.

The relationships shown in Table 2, when plotted in a graphical form, are as shown in FIG. 5.

As seen from Table 2, errors of the output currents $I_1$, $I_2$, $I_3$ and $I_4$ within a practical range of the input current $I_0$ in the circuit shown in FIG. 2 are of the order of 1% and hence the circuit of FIG. 2 is well adaptable for the D/A converter. When the current source circuit of the present invention is applied for the D/A converter, accuracies of the output currents $I_1$, $I_2$, $I_3$ and $I_4$, that is, the errors shown in Table 2, change with the number of bits. When the accuracies of the output currents $I_1$ to $I_4$ necessary for the D/A converter are defined with $\frac{1}{2}$ of the weight of an LSB (least significant bit), those are tabulated in Table 3.

TABLE 3

| Bit number | Resolution | Accuracy |
|---|---|---|
| 4 | 16 | 3.2 |
| 5 | 32 | 1.6 |
| 6 | 64 | 0.78 |
| 7 | 128 | 0.39 |
| 8 | 256 | 0.20 |

As the number of bits of a D/A converter becomes larger, the accuracies required for the output currents $I_1$ to $I_4$ are necessarily more strict, as shown in Table 3. Assume now that the input current $I_0$ is 100 $\mu A$. Since an error of the output current $I_1$ is 0.69% as shown in Table 2, a D/A converter of 6 bits may be realized by using the current source circuit of the present invention.

Figure 6:
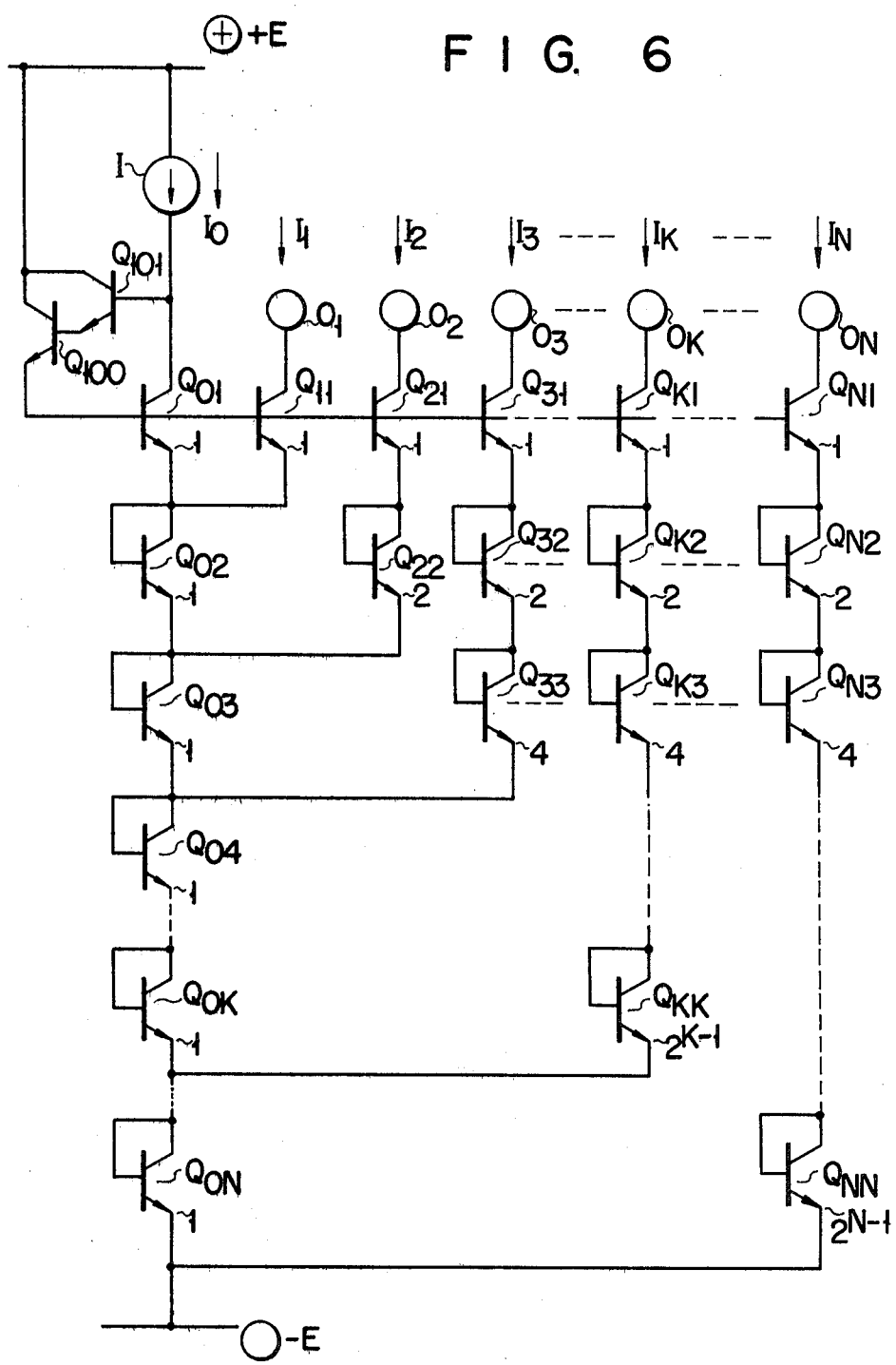
FIG. 6 is a circuit diagram of a third embodiment of a current source circuit for producing output currents of N bits according to the present invention.

Following the explanation of the 4-bit current source circuit referring to FIGS. 1 and 2, a current source circuit of N bits will now be given referring to FIG. 6. In FIG. 6, all of the transistors used are of NPN type. The collector of the first transistor $Q_{01}$ is connected through a positive current source I to a positive power source (+E) (a first power source). Inserted between the emitter of the first transistor $Q_{01}$ and a negative power source (−E) are a series of collector emitter paths of the first group transistors $Q_{02}, Q_{03}, \ldots, Q_{0K}, \ldots, Q_{0N}$ (K=2, 3, ..., N) of N−1 of which the collectors and the bases are connected together in this order. The transistors $Q_{01}, Q_{02}, \ldots, Q_{0K}, \ldots, Q_{0N}$ make up a main current path of the current source circuit. Second group transistors $Q_{11}, Q_{21}, \ldots, Q_{K1}, \ldots, Q_{N1}$ (K=1, 2, ..., N) are so arranged that the bases of the second group transistors are commonly connected to the base of the first transistor $Q_{01}$, and the collectors thereof are connected to the current output terminals $O_1, O_2, \ldots, O_K, \ldots, O_N$, respectively. The emitter of the second group transistor $Q_{11}$ is connected to the emitter of the first transistor $Q_{01}$. The third group transistors $Q_{22}; Q_{32}$ and $Q_{33}; Q_{K2}, Q_{K3}, \ldots, Q_{KK}$ and $Q_{N2}, Q_{N3}, \ldots, Q_{NN}$ are so arranged that those transistors are connected together at the collector and the base. The emitter-collector path of the third group transistor $Q_{22}$ is connected between the emitters of the second group transistor $Q_{21}$ and the first group transistor $Q_{02}$. The emitter-collector paths of the third group transistors $Q_{32}$ and $Q_{33}$ are connected in series between the emitters of the second group transistor $Q_{31}$ and the first group transistor $Q_{03}$. The collector emitter-paths of the third group transistors $Q_{K2}, Q_{K3}, \ldots, Q_{KK}$ are connected in series between the emitters of the second group transistor $Q_{K1}$ and the first group transistor $Q_{0K}$. The emitter-collector paths of the third group transistor $Q_{N2}, Q_{N3}, \ldots, Q_{NN}$ are connected in series between the emitters of the second group transistor $Q_{N1}$ and the first group transistor $Q_{0N}$. The third group transistors $Q_{22}, Q_{32}, \ldots, Q_{K2}, \ldots, Q_{N2}$ are multi-emitter transistors having emitters of $2^1$. The third group transistors $Q_{33}, \ldots, Q_{K3}, \ldots, Q_{N3}$ are multi-emitter transistors having emitters of $2^2$. The third group transistor $Q_{KK}$ is a multi-emitter transistor having emitters of $2^{K-1}$. The transistor $Q_{NN}$ is a multi-emitter transistor having emitters of $2^{N-1}$. In other words, when the emitter areas of the first transistor $Q_{01}$, the first group transistors $Q_{02}$ to $Q_{0N}$, and the second group transistors $Q_{11}$ to $Q_{N1}$ are expressed each by "1", the emitter areas of the transistors having the emitters of $2^1, 2^2, \ldots, 2^{K-1}, \ldots, 2^{N-1}$ are $2^1, 2^2, \ldots, 2^{K-1}, \ldots, 2^{N-1}$, respectively. To further describe the third group transistors, when K is 2, 3, ..., N, the number of the transistors of which the collector-emitter paths are connected in series between the emitters of the second group transistor $Q_{K1}$ and the first group transistor $Q_{0K}$ is K−1 ($Q_{K2}, Q_{K3}, \ldots, Q_{KK}$), and the number of emitters are $2^1, 2^2, \ldots, 2^{K-1}$, respectively. Since K may take any one of those numerals 2, 3, ..., N, the total number of the third group transistors is expressed by $$\sum_{K=1}^{K=N} (K-1).$$

The circuit shown in FIG. 6 contains the second transistor $Q_{100}$ for correcting the output current already described referring to FIG. 3, and a third transistor $Q_{101}$ for the same purpose. The collector, base and emitter of the second transistor $Q_{100}$ are connected to the first power source, the emitter of the third transistor $Q_{101}$ and the base of the first transistor $Q_{01}$, respectively. The collector and base of the third transistor $Q_{101}$ are connected to the collector of the second transistor $Q_{100}$ and the collector of the first transistor $Q_{01}$, respectively. The operation of the current source circuit shown in FIG. 6 will easily be understood by skilled persons in the art when carefully reading the explanation of FIG. 1. The current values derived from the output terminals $O_1, O_2, O_3, \ldots, O_K, \ldots, O_N$ are expressed by $I_0 \times 2^0$, $I_0 \times 2^1, I_0 \times 2^2, \ldots, I_0 \times 2^{K-1}, \ldots, I_0 \times 2^{N-1}$ in geometrical progression, for the current value $I_0$ of the current source I.

Figure 7:
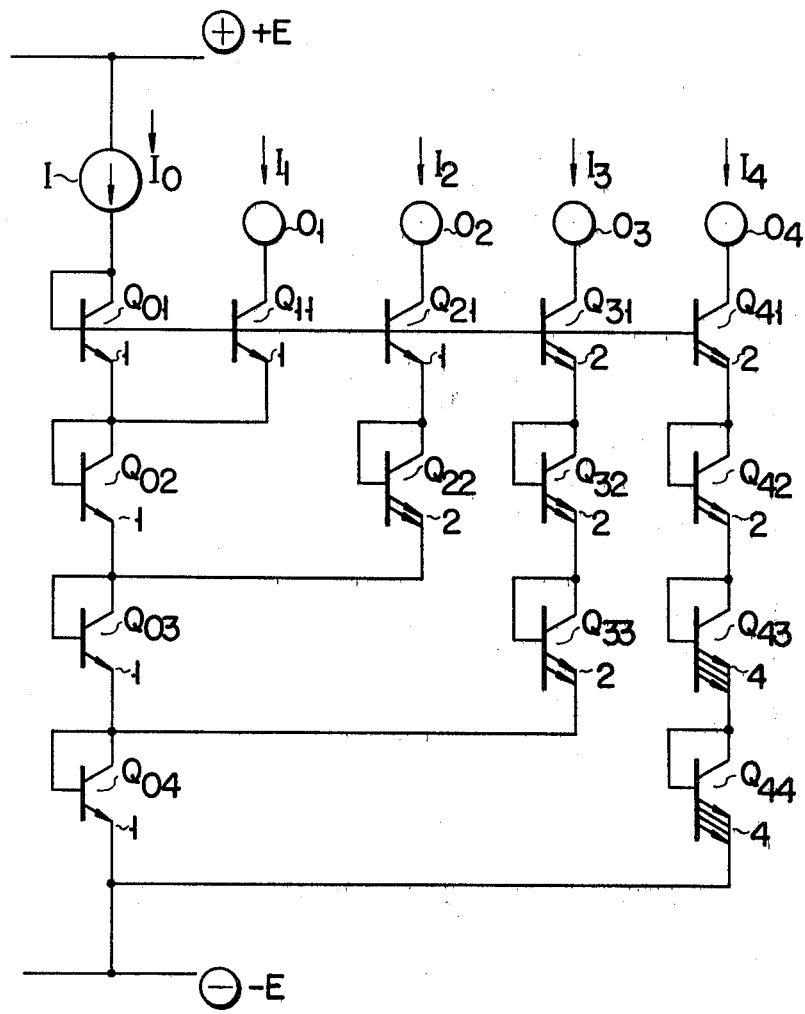
FIG. 7 is a circuit diagram of a fourth embodiment of a current source circuit for producing 4-bit output currents according to present invention.

Another embodiment of a current source circuit according to the present invention will be described referring to FIG. 7. Differences of the embodiment shown in FIG. 7 from that in FIG. 1 is that the second group transistor $Q_{31}$ and the third group transistor $Q_{33}$ have each two emitters, the second group transistor $Q_{41}$ has two emitters, and the third group transistor $Q_{44}$ has four emitters. The operation and effects of the embodiment shown in FIG. 7 are exactly the same as those of the FIG. 1 embodiment. The reason why those are equal to each other will be described referring to Table 4.

TABLE 4

| Circuit with 2nd and 3rd group transistors | Product of emitter areas of FIG. 1 | Product of emitter areas of FIG. 7 | Output current |
|---|---|---|---|
| $Q_{11}$ | 1 | 1 | $I_1 = I_0$ |
| $Q_{21} - Q_{22}$ | $1 \times 2 = 2$ | $1 \times 2 = 2$ | $I_2 = \sqrt[2]{2^2} I_0 = 2I_0$ |
| $Q_{31} - Q_{32} - Q_{33}$ | $1 \times 2 \times 4 = 8$ | $2 \times 2 \times 2 = 8$ | $I_3 = \sqrt[3]{8^2} I_0 = 4I_0$ |
| $Q_{41} - Q_{42} - Q_{43} - Q_{44}$ | $1 \times 2 \times 4 \times 8 = 64$ | $2 \times 2 \times 4 \times 4 = 64$ | $I_4 = \sqrt[4]{64^2} I_0 = 8I_0$ |

As seen from Table 4, the emitter area product of the circuit $Q_{31}$-$Q_{32}$-$Q_{33}$ is $1 \times 2 \times 4$ in FIG. 1 and $2 \times 2 \times 2 = 8$ in FIG. 7. That is, the product of areas of those circuits are equal to each other. The product of areas of the circuit $Q_{41}$-$Q_{42}$-$Q_{43}$-$Q_{44}$ is $1 \times 2 \times 4 \times 8 = 64$ in FIG. 1 and $2 \times 2 \times 4 \times 4 = 64$ in FIG. 2 and those are equal to each other. Therefore, the relations $I_1 = I_0$; $I_2 = 2I_0$; $I_3 = 4I_0$; and $I_4 = 8I_0$ are obtained in accordance with the equations shown in Table 4. According to the current source circuit of the present embodiment, the manufacturing process of the transistors is simple. In the embodiment shown in FIG. 6, the number of the emitters of the second and third group transistors can be controlled through the calculation in accordance with Table 4.

What is claimed is:

1. A current source circuit for producing a plurality of currents with their own weights, comprising:

a first transistor including a collector connected to a first power source through a current source, and a base electrode coupled to the collector, the emitter area thereof being a reference value "1";

a first group of (N−1) transistors including a first transistor, a second transistor, . . . , a (K−1)th transistor, . . . , and an (N−1)th transistor connected in series, the base electrode of each said first group transistors being connected to the collector thereof, the collector of said first transistor of said first group transistors being connected to the emitter of said first transistor, the emitter of said (N−1)th transistor of said first group of transistors being connected to a second power source, and the emitter area of each of said first group transistors being a reference value "1";

a second group of (N) transistors including a first transistor, a second transistor, . . . , a Kth transistor, . . . , and an Nth transistor each having a base electrode connected to the base electrode of said first transistor, the collectors of said first, second, . . . , Kth, . . . , and Nth transistors of said second groups transistors producing currents with their own weights;

the emitter of said first transistor of said second group of transistors being connected to the emitter of said first transistor;

a third group of transistors including first, second, . . . , (K−1)th, . . . , and (N−1)th subgroups, the base electrode of each of said third group transistors being connected to the collector thereof; said first subgroup including a single subgroup transistor connected at its collector to the emitter of said second transistor of said second group transistors, and at its emitter to the emitter of said first transistor of said first group transistors; said second subgroup including first and second transistors connected in series, said first transistor of said second subgroup being connected at its collector to the emitter of a third transistor of said second group transistors, said second transistor of said second subgroup being connected at its emitter to the emitter of said second transistor of said first group transistors; said (K−1)th subgroup including a first transistor, a second transistor, . . . , and a (K−1)th transistor, said first transistor of said (K−1)th subgroup being connected at its collector to the emitter of said Kth transistor of said second group transistors and said (K−1)th transistor of said (K−1)th subgroup being connected at its emitter to the emitter of said (K−1)th transistor of said first group transistors; and said (N−1)th subgroup including a first transistor, a second transistor, . . . , and an (N−1)th transistor connected in series, said first transistor of said (N−1)th subgroup being connected at its collector to the emitter of said Nth transistor of said second group transistors, and said (N−1)th transistor of said (N−1)th subgroup being connected at its emitter to the emitter of said (N−1)th transistor of said first group transistors;

the product of emitter areas of said Kth transistor of said second group transistors and each transistor of said (K−1)th subgroup being $$2 \sum_{I=1}^{I=K} (I-1).$$

2. A current source circuit according to claim 1, wherein the base electrode of said first transistor is connected to the collector thereof.

3. A current source circuit according to claim 1, herein the base electrode of said first transistor is connected to the collector thereof through the base emitter path of a transistor, the collector of said last mentioned transistor being connected to said first power source.

4. A current source circuit according to claim 1, wherein the base electrode of said first transistor is connected to the collector thereof through the base emitter path of a first bias transistor and the base emitter path of a second bias transistor connected in series, the collectors of said first and second bias transistors being connected to said first power source.

5. A current source circuit for producing a plurality of currents with their own weights, comprising:

a first transistor having its collector connected to a first power source through a current source and a base electrode coupled to its collector, the emitter area thereof being a reference value "1";

a first group of transistors including a first transistor, a second transistor, and a third transistor connected in series, the base electrode of each of said first group transistors being connected to the collector thereof, the collector of said first transistor of said first group transistors being connected to the emitter of said first transistor, the emitter of said third transistor of said first group transistors being connected to a second power source, and the emitter area of each of said first group transistors being a reference value "1";

a second group of transistors including a first transistor, a second transistor, a third transistor, and a fourth transistor each having its base electrode connected to the base electrode of said first transistor, the collector of said first, second, third and fourth transistors of said second group transistors producing said currents with their own weights, respectively;

each of said second group transistors having an emitter area of a reference value "1";

the emitter of said first transistor of said second group transistors being connected to the emitter of said first transistor;

a third group of transistors divided into first, second and third subgroups, each of said third group transistors being connected at its base electrode to the collector thereof;

said first subgroup including a single subgroup transistor which is connected at its collector to the emitter of said second transistor of said second group transistors and at its emitter to the emitter of said first transistor of said first group transistors;

said second subgroup including a first transistor and a second transistor connected in series, said first transistor of said second subgroup being connected at its collector to the emitter of said third transistor of said second group transistors, and said second transistor of said second subgroup being connected at its emitter to the emitter of said second transistor of said first group transistors;

said third subgroup including a first transistor, a second transistor, and a third transistor connected in series, said first transistor of said third subgroup being connected at its collector to the emitter of said fourth transistor of said second group transistors, and said third transistor of said third subgroup being connected at its emitter to the emitter of said third transistor of said first group transistors;

the emitter area of said first subgroup transistor being a reference value "2", the emitter areas of said first and second transistors of said second subgroup being reference values "2" and "4", respectively, and the emitter areas of said first, second and third transistors of said third subgroup being reference values "2", "4" and "8", respectively.

6. A current source circuit according to claim 5, wherein the base electrode of said first transistor is connected to the collector thereof.

7. A current source circuit according to claim 5, wherein the base electrode of said first transistor is connected to the collector thereof through the base emitter path of a transistor, the collector of said last mentioned transistor being connected to said first power source.

8. A current source circuit according to claim 5, wherein the base electrode of said first transistor is connected to the collector thereof through the base emitter path of a first bias transistor and the base emitter path of a second bias transistor connected in series, the collectors of said first and second bias transistors being connected to said first power source.

9. A current source circuit for producing a plurality of currents with their own weights, comprising:

a first transistor having its collector connected to a first power source through a current source and its base electrode coupled to the collector thereof, the emitter area thereof being a reference value "1";

a first group of transistors including first, second and third transistors connected in series, the base electrode of each of said first group transistors being connected to the collector thereof, the collector of said first transistor of said first group transistors being connected to the emitter of said first transistor, the emitter of said third transistor of said first group transistor being connected to a second power source and the emitter area of each of said first group transistors being a reference value "1";

a second group of transistors including a first transistor, a second transistor, a third transistor, and a fourth transistor each having it base electrode connected to the base electrode of said first transistor, the collectors of said first, second, third and fourth transistors of said second group transistors producing said currents with their own weights, respectively;

the emitter areas of said first, second, third and fourth transistors of said second group transistors being reference values "1", "1", "2" and "2", respectively;

the emitter of said first transistor of said second group transistors being connected to the emitter of said first transistor;

a third group of transistors divided into first, second and third subgroups, each of said third group transistors being connected at its base electrode to the collector thereof;

said first subgroup including a single subgroup transistor connected at its collector to the emitter of said second transistor of said second group transistors and at it emitter to the emitter of said first transistor of said first group transistors;

said second subgroup including a first transistor and a second transistor connected in series, said first transistor of said second subgroup being connected at its collector to the emitter of said third transistor of said second group transistors, and said second transistor of said second subgroup being connected at its emitter to the emitter of said second transistor of said first group transistors;

said third subgroup including a first transistor, a second transistor, and a third transistor connected in series, said first transistor of said third subgroup being connected at its collector to the emitter of said fourth transistor of said second group transistors, and said third transistor of said third subgroup being connected at its emitter to the emitter of said third transistor of said first group transistors;

the emitter area of said first subgroup transistor being a reference value "2", the emitter areas of said first and second transistors of said second subgroup being reference values "2" and "2", respectively, and the emitter areas of said first, second and third transistors of said third subgroup being reference values "2", "4" and "4" respectively.

10. A current source circuit according to claim 9, wherein the base electrode of said first transistor is connected to the collector thereof.

11. A current source circuit according to claim 9, wherein the base electrode of said first transistor is connected to the collector thereof through the base emitter path of a transistor, the collector of said last mentioned transistor being connected to said first power source.

12. A current source circuit according to claim 9, wherein the base electrode of said first transistor is connected to the collector thereof through the base emitter path of a first bias transistor and the base emitter path of a second bias transistor connected in series, the collectors of said first and second bias transistors being connected to said first power source.

* * * * *

UNITED STATES PATENT AND TRADEMARK OFFICE
CERTIFICATE OF CORRECTION

PATENT NO. : 4,442,399
DATED : April 10, 1984
INVENTOR(S) : Katsumi NAGANO

It is certified that error appears in the above-identified patent and that said Letters Patent is hereby corrected as shown below:

On the title page:

The name of the assignee should read "Tokyo Shibaura Denki Kabushiki Kaisha".

IN THE CLAIMS:

Claim 9, column 12, line 17, "it" should read --its--.

Signed and Sealed this

Second Day of July 1985

[SEAL]

Attest:

DONALD J. QUIGG

Attesting Officer    Acting Commissioner of Patents and Trademarks